(12) United States Patent
Van Helvoort et al.

(10) Patent No.: US 7,750,635 B2
(45) Date of Patent: Jul. 6, 2010

(54) RF RECEIVE COIL ASSEMBLY WITH INDIVIDUAL DIGITIZERS AND MEANS FOR SYNCHRONIZATION THEREOF

(75) Inventors: Marinus Johannes Adrianus Maria Van Helvoort, Eindhoven (NL); Filips Van Liere, Eindhoven (NL); Lambertus De Vries, Eindhoven (NL); Johannes Hendrik Den Boef, Eindhoven (NL); Marcellus Hendricus Marinus Waltherus Melters, Eindhoven (NL); Cornelis Leonardus Gerardus Ham, Eindhoven (NL); Marc Saes, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 545 days.

(21) Appl. No.: 11/718,451

(22) PCT Filed: Oct. 31, 2005

(86) PCT No.: PCT/IB2005/053549

§ 371 (c)(1),
(2), (4) Date: May 2, 2007

(87) PCT Pub. No.: WO2006/048816

PCT Pub. Date: May 11, 2006

(65) Prior Publication Data

US 2009/0267601 A1 Oct. 29, 2009

(30) Foreign Application Priority Data

Nov. 4, 2004 (EP) .................................. 04105509

(51) Int. Cl.
*G01V 3/00* (2006.01)

(52) U.S. Cl. ...................................... 324/318; 324/322

(58) Field of Classification Search ......... 324/300–322; 600/407–422
See application file for complete search history.

(56) References Cited

U.S. PATENT DOCUMENTS

| | | | |
|---|---|---|---|
| 5,245,288 A | 9/1993 | Leussler | |
| 5,384,536 A | 1/1995 | Murakami et al. | |
| 5,578,925 A | 11/1996 | Molyneaux et al. | |
| 6,198,288 B1 * | 3/2001 | Gauss et al. | 324/322 |
| 6,377,048 B1 * | 4/2002 | Golan et al. | 324/318 |
| 6,704,594 B1 * | 3/2004 | Blank et al. | 600/423 |
| 6,873,153 B2 * | 3/2005 | Frydman | 324/307 |
| 7,271,588 B2 * | 9/2007 | Frydman | 324/318 |
| 7,382,129 B2 * | 6/2008 | Mills | 324/318 |
| 7,511,492 B2 * | 3/2009 | Sodickson et al. | 324/309 |
| 2007/0164737 A1 * | 7/2007 | Pusiol | 324/306 |
| 2008/0191695 A1 * | 8/2008 | Van Helvoort et al. | 324/314 |
| 2009/0230966 A1 * | 9/2009 | Ehnholm | 324/322 |
| 2009/0251141 A1 * | 10/2009 | Baumgartl et al. | 324/307 |

FOREIGN PATENT DOCUMENTS

| | | |
|---|---|---|
| JP | 06209922 A | 8/1994 |
| JP | 9024036 A | 1/1997 |
| JP | 2001224572 A | 8/2001 |
| WO | 2004089211 A2 | 10/2004 |

OTHER PUBLICATIONS

Scott, C., et al.; Wireless Transponders of RF Coils: Systems Issues; 2005; Proc. Intl. Soc. Mag. Reson. Med.; 13; pp. 330.

\* cited by examiner

*Primary Examiner*—Brij B Shrivastav

(57) ABSTRACT

The invention relates to a device (1) for magnetic resonance imaging of a body (7) placed in a stationary and substantially homogeneous main magnetic field comprising a main magnet (2) for generation of a stationary and substantially homogeneous main magnetic field within the examination zone. In order to provide an MR device (1) which is arranged to allow for massive parallel imaging without extensive cabling between the individual receiving coils and the back end electronics, the invention proposes to make provision for a plurality of receiving units (10*a*, 10*b*, 10*c*) placed in or near the examination zone, which receiving units (10*a*, 10*b*, 10*c*) each comprise a receiving antenna (12*a*, 12*b*, 12*c*) for receiving MR signals from the body, a digitizing means (21*a*, 21*b*, 21*c*) for sampling the received MR signals and for transforming the signal samples into digital signals, and a transmitter (22*a*, 22*b*, 22*c*) for transmitting the digital signals to a central processing unit (13). Further, the device (1) comprises synchronization means (17) for synchronizing the operation of the individual digitizing means (21*a*, 21*b*, 21*c*) of the receiving units (10*a*, 10*b*, 10*c*).

17 Claims, 2 Drawing Sheets

Figure 1:
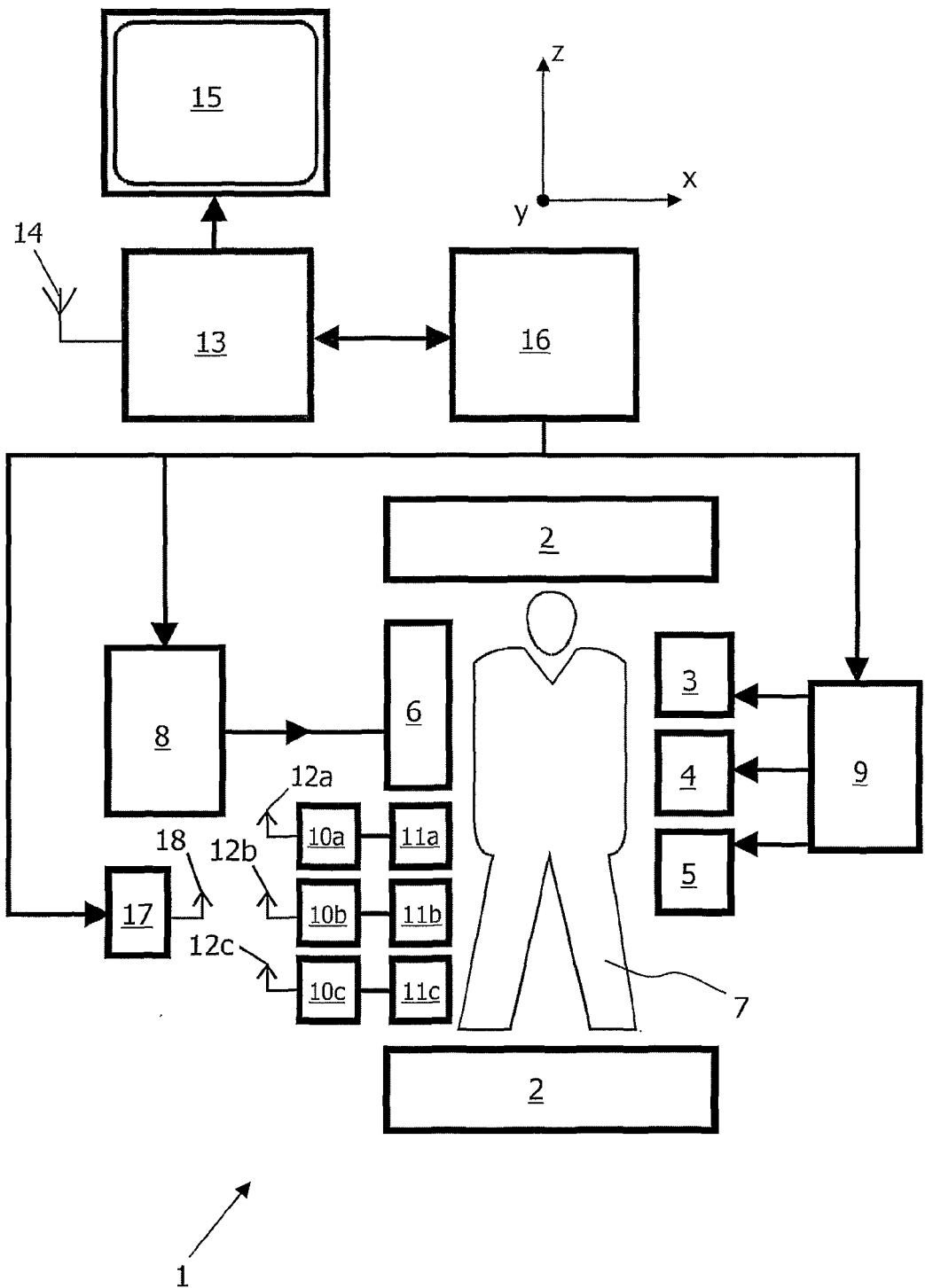

RF RECEIVE COIL ASSEMBLY WITH INDIVIDUAL DIGITIZERS AND MEANS FOR SYNCHRONIZATION THEREOF

The invention relates to a device for magnetic resonance (MR) imaging of a body placed in an examination zone.

Furthermore, the invention relates to a method for MR imaging and to a computer program for an MR imaging device.

In MR imaging, pulse sequences consisting of RF and magnetic field gradient pulses are applied to an object (the body of a patient) to generate phase encoded magnetic resonance signals, which are scanned by means of receiving antennas in order to obtain information from the object and to reconstruct images thereof. Since its initial development, the number of clinical relevant fields of application of MRI has grown enormously. MRI can be applied to almost every part of the body, and it can be used to obtain information about a number of important functions of the human body. The pulse sequence which is applied during an MR scan determines completely the characteristics of the reconstructed images, such as location and orientation in the object, dimensions, resolution, signal-to-noise ratio, contrast, sensitivity for movements, etcetera. An operator of an MRI device has to choose the appropriate sequence and has to adjust and optimize its parameters for the respective application.

In known parallel MRI techniques, multiple receiving antennas with different spatial sensitivity profiles are employed, for example to enhance local sensitivity or to reduce the scan time for a diagnostic image. The latter can be achieved, for example, in accordance with the known SENSE technique by acquiring a smaller set of phase encoded magnetic resonance signals than would actually be necessary to completely cover the predetermined field of view in accordance with Nyquist's theorem.

The above-described SENSE technique as well as other known parallel MR imaging techniques have proven to be very efficient for practical applications. Therefore, modern MR systems increasingly demand massive parallel imaging. This necessarily requires the use of a high number of MR receiving antennas (coils) located in the examination zone of the MR device, each antenna being associated with a separate receiving channel. For connecting the individual receiving antennas to the back end electronics of the MR device, which is usually located outside the actual examination room, many cables are required. This cabling is expensive and also bulky, which is a major concern when considering the limited space within the examination volume of common MR devices. Particularly in the case of receiving coils integrated in a moving patient support, the necessary cabling is a technical challenge and therefore cost-intensive. The more antennas are used in MR imaging, the more complex the cable handling around the body of the examined patient becomes. Usually, so-called combiner boxes located near the examination zone are used, in which the cables from the individual receiving coils are bundled. From the combiner boxes multifunctional cables lead to the back end electronics of the MR device. Naturally, these multifunctional cables and also the corresponding combiner boxes comprise a plurality of metallic parts and wires. It is a known problem that these metallic parts and wires tend to disturb the radio frequency field in the examination zone and can cause a high local specific absorption rate (SAR) in the tissue of the examined body in the vicinity of the respective metallic parts and wires. This is a major issue with regard to safety of operation of the MR device. For example, a patient may experience local burns of the skin in areas close to wires connecting the receiving antennas to the central processing unit of the MR device.

It is known for example from U.S. Pat. No. 5,245,288 that cabling between MR receiving antennas and the remote signal processing electronics of an MR device can be dispensed with by using wireless transmission of the received and demodulated MR signals from a receiving unit located in the vicinity of the examination zone to the central processing unit of the MR device. The known system uses a mixing stage in which the received MR signal is mixed with a mixing signal of constant frequency. This mixing signal is derived from a reference signal which is also transferred wirelessly to the receiving unit of the known system.

This known technique is unfortunately not applicable for parallel imaging. When using a plurality of wireless receiving units of the known kind, random phase differences and phase fluctuations between the individual mixing stages would cause undesirable image artifacts. Furthermore, the technique of the known system does principally not allow for wireless transmission of MR signals from a plurality of receiving units in parallel due to unresolvable interference of the individual transmission signals.

Therefore it is readily appreciated that there is a need for an improved device for MR imaging which allows for massive parallel imaging using a plurality of receiving antennas. It is consequently the primary object of the present invention to provide an MR device which is arranged to transfer the MR signals received by the individual receiving antennas to the central processing unit of the MR device in parallel without excessive cabling.

In accordance with one aspect, an MR device for magnetic resonance imaging of a body placed in an examination zone is provided. The device comprises a main magnet for generation of a stationary and substantially homogeneous main magnetic field within the examination zone. Provision is made for a plurality of receiving units placed in or near the examination zone, which receiving units each comprise a receiving antenna for receiving MR signals from the body. The individual receiving units have digitizing means for sampling the received MR signals and for transforming the signal samples into digital signals, which are then transmitted to a central processing unit. The device of the invention further comprises synchronization means for synchronizing the sampling of the MR signals.

One aspect is to transfer a considerable part of the digital electronics from the back end of known MR devices into the examination zone such that the number of cables required between the magnet and the central processing unit can be significantly reduced. The invention enables a drastic increase of the number of receiving channels over conventional MR systems. For the above reasons, a corresponding high number of cables between the individual receiving coils and the back end electronics cannot be handled with the conventional techniques anymore.

In one aspect, each individual receiving unit comprises a digitizing means for transforming the MR signals into digital signal samples, thus enabling the parallel (multiplexed) transfer by digital data transmission without interference between the individual signals. For this purpose, each receiving unit of the MR device also has to be provided with an appropriate transmitter. It is particularly advantageous that only a single common digital data connection for the data transmission between the receiving units and the central processing is required.

The important issue of synchronization of the individual receiving channels of the MR device is also addressed. The receiving units of the device are operating independently. The sampling clocks of the digitizing means of the individual receiving units would have different and random phase relations without the synchronization means. This would cause severe phase distortions of the transmitted signals. For enabling parallel imaging, the MR device comprises synchronization means synchronizing the operation of the individual digitizing means of the receiving units. The synchronization means ensure that the sampling times of the different digital signal samples are well defined for each receiving channel, such that phase errors having adverse effects on image quality are effectively avoided.

It has to be noted that the synchronization only serves for precise temporal determination of the operation of the digitizing means. It is absolutely not necessary within the meaning of the invention that the signal sampling is performed with identical timing by the individual electronics of the different receiving units.

It has further to be noted that the synchronization of the receiver units does not need to be established over the entire scan duration. In accordance with the invention it is sufficient having the timing of the digitizing means well defined only during the actual signal acquisition. An MR scan typically lasts up to a few minutes and comprises a few hundred to several thousands of acquisition periods, each of the acquisition periods taking only a few milliseconds or even less than a millisecond. Thus there is a requirement for synchronization only during a small time fraction of the complete MR imaging scan.

With the device it is advantageous if the transmitters of the receiving units are adapted for wireless radio transmission of the digital signals to the central processing unit. Since a completely wireless communication between the individual receiving units and the back end electronics of the MR apparatus is established in this way, the above-mentioned drawbacks of extensive cabling can be effectively avoided. For this embodiment the individual receiving units of the MR device comprise appropriate transducers for converting the digital signals into (modulated) radio frequency signals. Standardized electronic components for wireless digital communication with sufficient bandwidth are known as such and are commercially available at low cost. Such components, well known for example in the field of wireless local area computer networks (WLAN), operate for example at a carrier frequency in the 2.4 GHz band and advantageously provide a high data rate that suffices for the application of the invention, even if a comparatively large number of receiving units is employed in parallel.

As an alternative, the transmitters of the receiving units can be adapted for transmission of the digital signals to the central processing unit over an optical fibre. Optical data transmission also has the advantage that standardized electronic components are commercially available and that the achievable data rates are high. Since optical fibres are required, the above-mentioned problems in connection with complex cabling cannot be completely avoided. But optical fibres still have the advantage that they include no metallic parts or wires such that the radio frequency field in the examination zone cannot be disturbed and problems relating to increase SAR are also avoided.

The synchronization means of the MR device in accordance with the invention may comprise a reference signal generator for generation of a reference signal that is supplied to the receiving units. This reference signal can for example be used to establish a fixed phase relation of the sampling clocks of the digitizing means of the individual receiving units.

In accordance with one embodiment of the invention, the reference signal can simply be a pilot tone that is generated in the examination zone having a frequency close to the frequency of the MR signals. The MR signals usually have a bandwidth between 500 Hz and 1.5 MHz. The signals picked up by the receiving antennas of the receiving units are these MR signals spaced around the Larmor frequency (e.g. 64 MHz at 1.5 T). The pilot tone can be generated just outside the signal bandwidth of the MR signals such that it will still be received by the receiving antennas of the individual receiving units together with the actual MR signals without interfering with the MR signals. The pilot tone then propagates throughout the complete receive chain of the MR device and can be used to synchronize the distributed electronics of the receiving units. In the most simple case, the pilot tone is used not until image reconstruction to relate all signal samples received in parallel to a common time frame. With this embodiment, synchronization of the operation of the digitizing means is performed as a pure post-processing of the digital signals. It is of course also possible to provide the reference signal to the digitizing electronics of the receiving units over an appropriate wired connection. If demodulation of the received MR signals is performed by the receiving units prior to digitization, the reference signal may for example be injected into the corresponding base band signal to provide a common time frame for the digital signals.

It has to be noted in this context, that the synchronization means of the MR device according to the invention may not necessarily serve to physically control the operation of the individual digitizing means. When a reference signal is employed in the afore described manner, the actual digitization of the signals acquired with the different receiving units is performed independently and therefore in a virtually asynchronous manner. Synchronization in the context of the invention means merely definition of a common time frame for signal sampling. For this purpose, the actual physical operation of the different digitizing means is not necessarily affected by the synchronization means within the meaning of the invention.

According to a further embodiment of the invention, the receiving units may be arranged such that the sampling frequencies of the digitizing means are derived from the reference signal. Conventional MR devices make use of a single central clock from which multiple frequencies are derived as required, thereby achieving synchronous operation throughout the whole system. In conventional MR devices the distribution of the central clock is limited to the central processing unit, which is usually a single rack located outside the actual examination room. In accordance with this embodiment, the central clock signal can be supplied as a reference signal via appropriate cabling to wirelessly to the individual receiving units for establishing synchronous operation of their respective digitization means. Calibration of a delay of the central clock signal might be necessary since the time for propagation of the clock signal to the receiving units has to be taken into account. In a practical implementation of the invention using wireless transmission of the digital signals from the receiving units to the central processing units, the sampling clock of the digitizing means may be transmitted wirelessly as well. It may for example be derived from the carrier frequency of the radio frequency communication link or from other lower frequency signals. For this purpose, the receiving units may be equipped with local oscillators locked to the transmitted reference signal, for example by means of appropriate phase locked loop (PLL) circuits. The frequency of the wirelessly transmitted clock signal should preferably match an integer multiple of the actual sampling frequency of the digitizing means. Influences on the resulting MR image can be avoided in this way.

In accordance with one embodiment, the receiving units may each comprise a stretch generator which is controlled by a stretch controller of the synchronization means. The stretch controller prescribes the timing for the operation of the digitizing means of the individual receiving units. The stretch generator includes an input command first-in first-out (FIFO) buffer, a timer and 'next' and 'actual' registers. The output and input events of the stretch generator are controlled with high temporal precision (e.g. 1 nano second precision and 100 nano seconds resolution) by the commands stored in the FIFO buffer. Stretch generators can generally be used to generate waveforms. In MR devices stretch generators are employed for example for the control of front-end devices during MR measurements. In accordance with the invention, the stretch generator is used to precisely control the timing of the sampling of the received MR signals. The central processing unit of the MR device may comprise a stretch controller connected to the stretch generators of the individual receiving units via the respective communication link (wireless radio transmission or optical fibre). Bit errors occurring during signal transmission can advantageously be dealt with using the above-described principle of operation of the stretch generator/controller. A remote stretch operation may be implemented by establishing a stretch on the "far end" (i.e. on the end of the receiving units of the MR device) of the communication link. Two synchronized digital counters can be used on the "near end" (i.e. on the end of the back end electronics of the MR device) and on the "far end" of the communication link respectively to guarantee correct timing. For the synchronization of the respective counters a reference signal can be used in the way described above.

With the MR device of the invention it is also advantageous to employ a signal correlation means being arranged to correlate MR signals and/or noise signals received by different receiving units and to determine the sampling times of the digital signals generated by the digitizing means of the individual receiving units on the basis of this correlation. The receiving antennas of neighboring receiving units have an at least partially overlapping field of view and are at least residually inductively coupled. Because of this, the MR signals and also the noise registered by these receiving units are correlated. This correlation can be used to define a common time frame of the MR signals received and digitized by the individual receiving units. A synchronization of the operation of the receiving units can be achieved for example by recalculating the sampling times of the digital signals on the basis of the correlation before the actual image reconstruction.

The invention not only relates to a device but also to a method for magnetic resonance imaging of at least a portion of a body placed in an examination zone of an MR device, the method comprising the following steps: Exciting nuclear magnetization within the body by means of an MR imaging sequence comprising RF pulses and switched magnetic field gradients; acquiring MR signals from the body by means of a plurality of receiving units placed in or near the examination zone, which receiving units each comprise a receiving antenna; sampling the received MR signals and transforming the signal samples into digital signals, wherein synchronization means are used for synchronizing the operation of individual digitizing means of the receiving units; transmitting the digital signals to a central processing unit; and reconstructing an MR image from the digital signal samples.

A computer program adapted for carrying out the imaging procedure of the invention can advantageously be implemented on computer hardware for the control of magnetic resonance scanners. The computer program can be provided on suitable data carriers, such as CD-ROM or diskette. Alternatively, it can also be downloaded by a user from an Internet server.

The following drawings disclose preferred embodiments of the present invention. It should be understood, however, that the drawings are designed for the purpose of illustration only and not as a definition of the limits of the invention. In the drawings FIG. 1 shows an embodiment of a magnetic resonance scanner according to the invention, FIG. 2 shows schematically an arrangement of a plurality of receiving units and corresponding synchronization means in accordance with the invention.

In FIG. 1 a magnetic resonance imaging device 1 in accordance with the present invention is shown as a block diagram. The apparatus 1 comprises a set of main magnetic coils 2 for generating a stationary and homogeneous main magnetic field and three sets of gradient coils 3, 4 and 5 for superimposing additional magnetic fields with controllable strength and having a gradient in a selected direction. Conventionally, the direction of the main magnetic field is labelled the z-direction, the two directions perpendicular thereto the x- and y-directions. The gradient coils are energized via a power supply 9. The apparatus 1 further comprises a radiation emitter 6, an antenna or coil, for emitting radio frequency (RF) pulses to a body 7 placed in the examination zone of the device 1, the radiation emitter 6 being coupled to a modulator 8 for generating and modulating the RF pulses. Also provided are receiving units 10*a*, 10*b*, 10*c* placed in or near the examination zone of device 1. Each of the receiving units 10*a*, 10*b*, 10*c* comprises a receiving antenna 11*a*, 11*b*, 11*c* respectively for receiving MR signals from the body 7. These receiving antennas are forming a coil array for the purpose of parallel imaging. The receiving antennas 11*a*, 11*b*, 11*c* can for example be separate surface coils with different spatial sensitivity profiles as they are required for SENSE imaging. The received MR signals are sampled by the individual receiving units 10*a*, 10*b*, 10*c* and transformed into digital signals. The receiving units 10*a*, 10*b*, 10*c* are equipped with signal transmission antennas 12*a*, 12*b*, 12*c* for wireless radio transmission of the digital signals in a multiplexed fashion to a corresponding data processing unit 13, for example a computer equipped with an radio antenna 14, for transformation of the received digital magnetic resonance signals into an image, for example in accordance with the known SENSE technique. This image can be made visible on a visual display unit 15. The modulator 8, the emitter 6 and the power supply 9 for the gradient coils 3, 4 and 5 are controlled by a control system 16 to generate the actual imaging sequence for parallel imaging. The control system 16 is further connected to a synchronization means 17 for synchronization of the digitizing operation of the receiving units 10*a*, 10*b*, 10*c*. In the depicted embodiment of the MR device the synchronization means 17 generates a reference signal, a so-called pilot tone, that is wirelessly supplied via a pilot tone antenna 18 to the receiving units 10*a*, 10*b*, 10*c*. It is of course also possible to transmit the pilot tone via emitter 6 in an alternative embodiment. This pilot tone is registered by the receiving units 10*a*, 10*b*, 10*c* via the receiving antennas 11*a*, 11*b*, 11*c* together with the MR signals during image acquisition. The pilot tone propagates through the whole receiving chain of the device 1 and can be used by the processing unit 13 to define a common time frame for the digital signal samples generated by the individual receiving units 10*a*, 10*b*, 10*c*. In this way, the operation of the independent digitizing means of the receiving units 10*a*, 10*b*, 10*c* is synchronized as a pure post-processing step carried out by the central processing unit 13 during image reconstruction.

Figure 2:
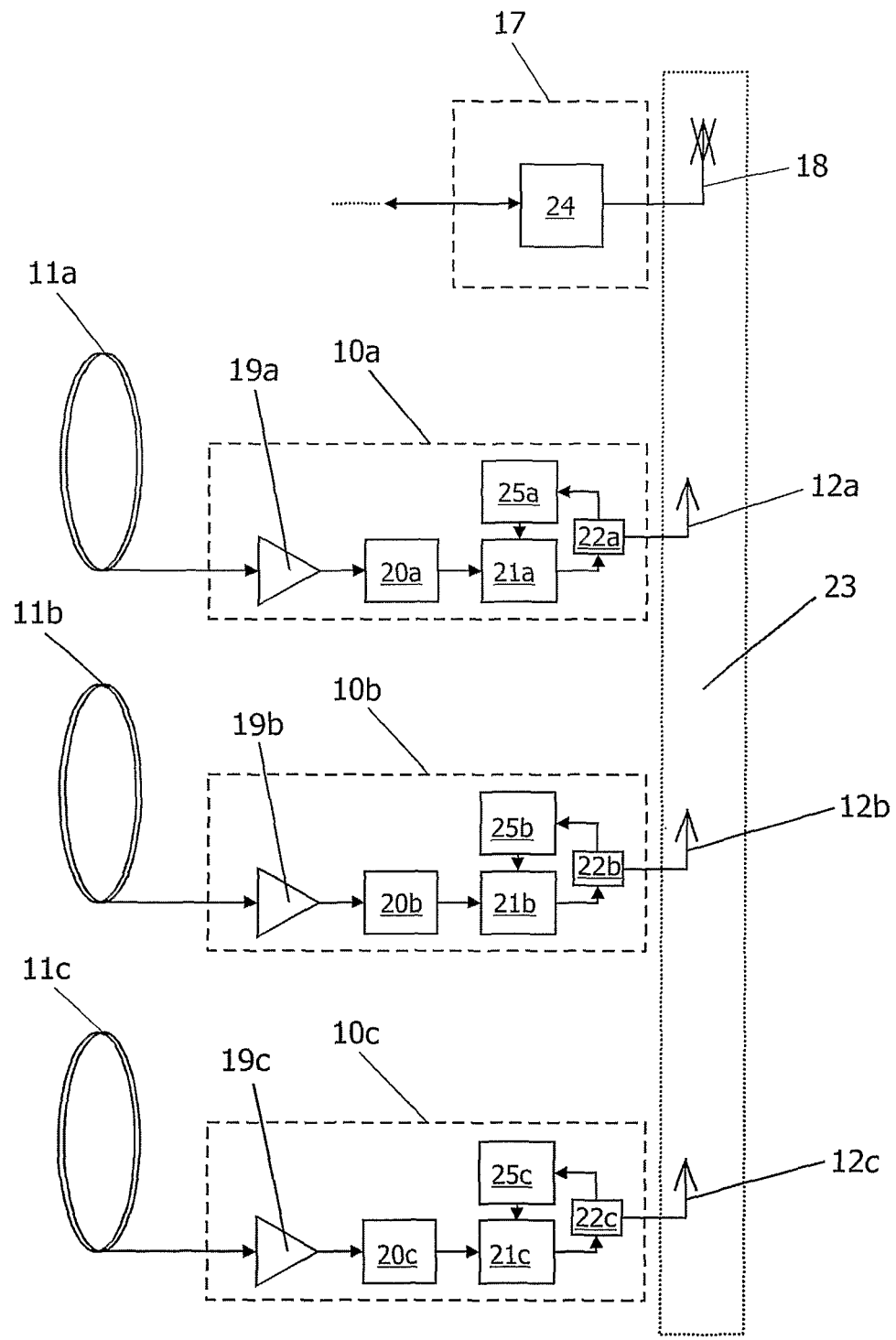

With reference to FIG. 2, an arrangement of a plurality of receiving units 10a, 10b, 10c and corresponding synchronization means 17 in accordance with the invention is shown. The receiving units 10a, 10b, 10c are equipped with receiving coils 11a, 11b, 11c for receiving MR signals from the body of an examined patient. The receiving coils 11a, 11b, 11c are connected to sensitive analog radio frequency preamplifiers 19a, 19b, 19c. The receiving units 10a, 10b, 10c further include variable attenuators 20a, 20b, 20c for adjusting the gain in accordance with the amplitude of the received MR signals. The attenuators 20a, 20b, 20c are connected to analog-to-digital converters 21a, 21b, 21c forming the digitizing means of the receiving units 10a, 10b, 10c. The digital signals generated by the analog-to-digital converters are supplied to transmitters 22a, 22b, 22c for (multiplexed) digital radio transmission over a wireless radio communication link 23 of the MR device. For this purpose, each of the receiving units is equipped with a radio signal transmission antenna 12a, 12b, 12c. The synchronization means 17 of the embodiment depicted in FIG. 2 comprises a wireless digital radio communication module 24 connected to antenna 18 for establishing the radio communication between the receiving units 10a, 10b, 10c and a central processing unit of the MR device not depicted in FIG. 2. For the purpose of synchronization of the operation of the digitizing means 21a, 21b, 21c of the individual receiving units 10a, 10b, 10c in accordance with the invention, the sampling clocks of the analog-to-digital converters 21a, 21b, 21c are derived from local oscillators 25a, 25b, 25c being connected to the transmitters 22a, 22b, 22c. The local oscillators 25a, 25b, 25c are locked to the carrier frequency of the digital communication link 23, for example by means of an appropriate PLL circuit not depicted in FIG. 2.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. An MR device for parallel magnetic resonance imaging of a body placed in an examination zone, the device comprising:
   a main magnet which generates a stationary and substantially homogeneous main magnetic field within the examination zone;
   a plurality of receiving units placed in or near the examination zone, which receiving units each comprise:
      a receiving antenna for receiving MR signals from the body, the receiving antennae of each receiving unit having different spatial sensitivity profiles,
      a digitizer which samples the received MR signals and digitizes the signal samples to form digital signals,
      a timing control unit which controls a timing of the digitizer, and
      a transmitter which transmits the digital signals to a central processing unit; and
   a synchronization unit which controls the timing control units of each of the plurality of receiving units to synchronize the sampling of the MR signals in the plurality of receiving units.

2. The MR device of claim 1, wherein the transmitters of the receiving units are adapted for wireless radio transmission of the digital signals to the central processing unit.

3. The MR device of claim 1, wherein the transmitters of the receiving units are adapted for transmission of the digital signals to the central processing unit over an optical fiber.

4. The MR device of claim 1, wherein the synchronization unit includes a reference signal generator which generates a reference signal, which reference signal is supplied to the receiving units.

5. The MR device of claim 4, wherein the reference signal is a radio frequency, signal which is received by the antennae of the receiving units in addition to the MR signals.

6. The MR device of claim 4, wherein the timing control units of the receiving units control sampling frequencies of the digitizers in accordance with the reference signal.

7. The MR device of claim 1, wherein the synchronization unit includes a wireless radio communication link which generates an RF synchronization signal that is received by the antennae of the plurality of receiving units.

8. The MR device of claim 1, wherein the timing control unit of each receiving unit includes a sampling clock which is locked to a carrier frequency of the transmitter of the receiving unit.

9. The MR device of claim 1, wherein the synchronization unit includes a central clock that controls the timing control units to control sampling frequencies of the digitizers.

10. An MR device for magnetic resonance imaging of a body placed in an examination zone, the device comprising:
    a main magnet which generates a stationary and substantially homogeneous main magnetic field within the examination zone;
    a plurality of receiving units disposed in or near the examination zone, which receiving units each include:
       a receiving antenna which receives MR signals from the body,
       a digitizer which samples the received MR signals and transforms the sampled signals into digital signals, and
       a transmitter which transmits the digital signals to a central processing unit;
    a synchronization unit which includes a stretch generator which controls timing of the digitizer; and,
    a stretch controller, which stretch controller prescribes the timing for digitizers of the individual receiving units, to synchronize the sampling of the MR signals.

11. An MR device for magnetic resonance imaging of a body placed in an examination zone, the device comprising:
    a main magnet which generates a stationary and substantially homogeneous main magnetic field within the examination zone;
    a plurality of receiving units disposed in or near the examination zone, which receiving units each include a receiving antenna which receives MR signals from the body, a digitizer which samples the received MR signals and transforms the sampled signals into digital signals, and a transmitter which transmits the digital signals to a central processing unit; and
    a signal correlation unit, which signal correlation unit correlates the received MR signals and/or noise signals received by the plurality of receiving units and determines sampling times of the digital signals generated by the digitizers of the individual receiving units on the basis of this correlation to synchronize the sampling of the MR signals.

12. A method of MR imaging of at least a portion of a body placed in an examination zone of an MR device, the method comprising:
    exciting nuclear magnetization within the body portion;

acquiring MR signals from the body portion with a plurality of receiving units placed in or near the examination zone;
generating a reference signal;
with each of the receiving units, sampling the received MR signals and digitizing the sampled signals with timing controlled in accordance with the reference signal to generate digital signals;
transmitting the digital signals; and
receiving the transmitted digital signals and reconstructing an MR image from the transmitted digital signals.

13. The method of claim 12, wherein the digital signals are transmitted from the receiving units to the central processing unit over a wireless digital data connection.

14. The method of claim 12, further including:
multiplexing the digital signals from the plurality of receiving units and transmitting the multiplexed digital signals.

15. The method of claim 12, further including:
generating a reference RF signal;
receiving the reference RF signal with the receiving unit;
controlling a sampling rate at which the MR signals are sampled and digitized in accordance with a frequency of the reference RF signal.

16. A tangible computer readable medium carrying a computer program which controls an MR device for:
generating an MR imaging sequence comprising RF pulses and switched magnetic field gradients to induce resonance in an examined object;
concurrently receiving MR signals with each of a plurality of receiving units;
in each of the receiving units, digitizing the received MR signals at a sampling rate;
synchronizing the sampling rate of MR signals of the plurality of receiving units of the MR device;
processing the digitized MR signals from the individual receiving units;
reconstructing an MR image from the digital signals.

17. The tangible computer readable medium of claim 16, wherein the carried computer program further controls the MR device to:
generate a reference signal;
receive the reference signal with each receiving unit; and
control the sampling rate in accordance with a frequency of the reference signal.

* * * * *